(12) United States Patent
Ishii et al.

(10) Patent No.: US 7,367,769 B2
(45) Date of Patent: May 6, 2008

(54) SEMICONDUCTOR PRODUCTION SYSTEM, CLUSTER TOOL, CONTROL METHOD OF SEMICONDUCTOR PRODUCTION SYSTEM AND MAINTENANCE METHOD OF CLUSTER TOOL

(75) Inventors: Tomoyuki Ishii, Nirasaki (JP); Masahiro Numakura, Miyagi-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/471,289

(22) PCT Filed: Mar. 18, 2002

(86) PCT No.: PCT/JP02/02538

§ 371 (c)(1),
(2), (4) Date: Sep. 22, 2003

(87) PCT Pub. No.: WO02/078065

PCT Pub. Date: Oct. 3, 2002

(65) Prior Publication Data

US 2004/0092069 A1 May 13, 2004

(30) Foreign Application Priority Data

Mar. 22, 2001 (JP) .............................. 2001-083148

(51) Int. Cl.
*H01L 21/677* (2006.01)
*G06F 7/00* (2006.01)
(52) U.S. Cl. ...................... 414/217; 414/939; 700/218
(58) Field of Classification Search ................ 414/217, 414/939, 940; 700/218, 228, 121; 118/719, 118/718; 198/437, 576
See application file for complete search history.

(56) References Cited

U.S. PATENT DOCUMENTS

| | | | |
|---|---|---|---|
| 5,611,655 A * | 3/1997 | Fukasawa et al. | 414/217 |
| 5,663,884 A * | 9/1997 | Nishihata et al. | 700/121 |
| 5,694,325 A * | 12/1997 | Fukuda et al. | 700/121 |
| 6,034,876 A * | 3/2000 | Ohno et al. | 361/752 |
| 6,053,980 A * | 4/2000 | Suda et al. | 118/719 |
| 6,069,096 A * | 5/2000 | Nishihata et al. | 700/229 |
| 6,167,320 A * | 12/2000 | Powell | 700/95 |
| 6,382,895 B1* | 5/2002 | Konishi et al. | 414/217 |
| 6,424,880 B1* | 7/2002 | Goder et al. | 700/121 |
| 6,461,434 B1* | 10/2002 | Winters et al. | 118/715 |
| 6,470,227 B1* | 10/2002 | Rangachari et al. | 700/95 |
| 2001/0041121 A1* | 11/2001 | Grunes et al. | 414/217 |
| 2002/0099465 A1* | 7/2002 | Su | 700/121 |
| 2003/0040830 A1* | 2/2003 | Parikh et al. | 700/121 |

FOREIGN PATENT DOCUMENTS

| | | |
|---|---|---|
| JP | 7-297254 | 11/1995 |
| JP | 8-172034 | 7/1996 |
| JP | 10-135095 | 5/1998 |

\* cited by examiner

*Primary Examiner*—Saul Rodriguez
*Assistant Examiner*—Gregory W Adams
(74) *Attorney, Agent, or Firm*—Oblon, Spivak, McClelland, Maier & Neustadt, P.C.

(57) ABSTRACT

PS control sections MC1, MC2 configured to independently control the operations in process ships PS1, PS2 are provided respectively, and an LM control section MC3 configured to control the operation in a loader module LM is provided independently.

With this structure, the operations of the process ships PS1, PS2 and the loader module LM can be checked while the process ships PS1, PS2 are not coupled to the loader module LM.

2 Claims, 7 Drawing Sheets

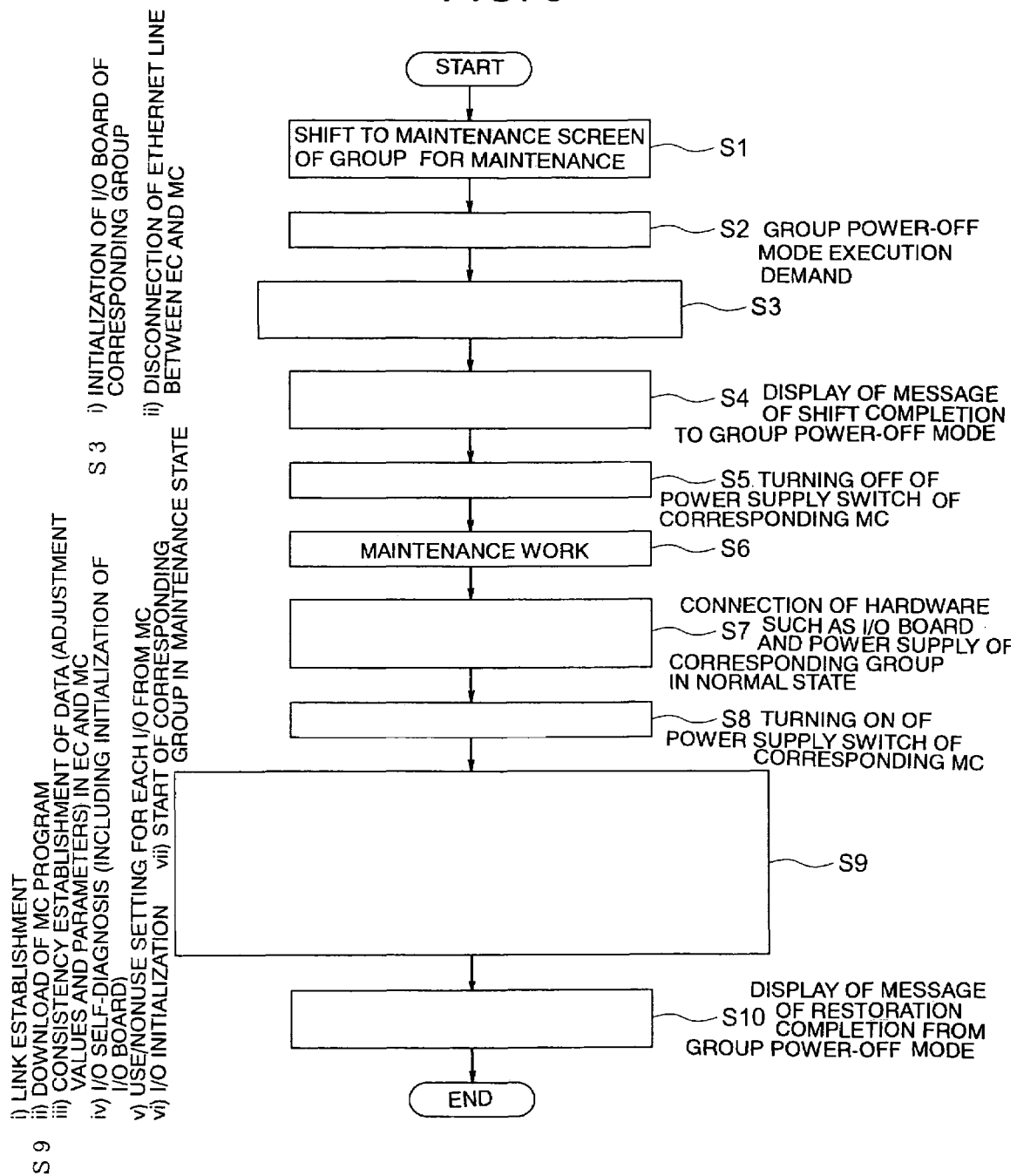

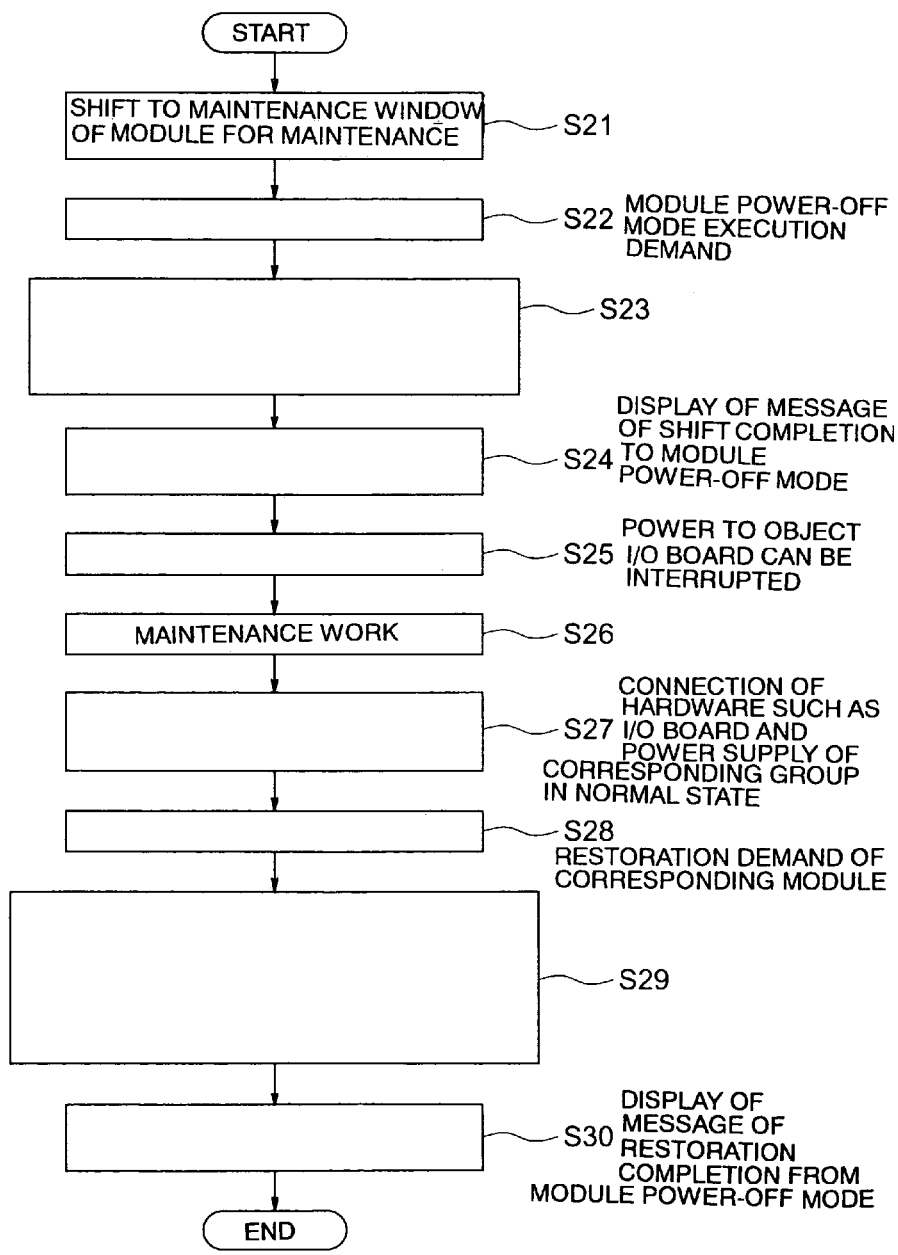

SEMICONDUCTOR PRODUCTION SYSTEM, CLUSTER TOOL, CONTROL METHOD OF SEMICONDUCTOR PRODUCTION SYSTEM AND MAINTENANCE METHOD OF CLUSTER TOOL

TECHNICAL FIELD

The present invention relates to a semiconductor production system, a cluster tool, a control method of the semiconductor production system, and a maintenance method of the cluster tool.

BACKGROUND ART

In some conventional semiconductor production systems, semiconductor devices are produced while a plurality of process ships intended for processing wafers or keeping the wafers on standby therein are coupled to a loader module intended for housing, transferring, and so on of the wafers, and in semiconductor production systems of such a type, additional installation of process ships is possible.

Here, when a process ship is to be additionally installed, the process ship to be additionally installed is coupled to the loader module and the whole system is operated in order to check the operation of the process ship. Further, when the maintenance of the process ship is to be performed, the electric power to the whole system is interrupted to stop the whole system.

However, in the method in which the whole system is operated in order to check the operation of the process ship, it is necessary to prepare all modules and parts and normally connect them, which has posed the problem of a long startup time of the system.

Moreover, in the method in which the whole system is stopped when the maintenance of the process ship is performed, there has been a problem that production efficiency is lowered since other process ships are caused to be in a non-operable state.

DISCLOSURE OF THE INVENTION

It is an object of the present invention to provide a semiconductor production system and a control method thereof in which a part of the system can be independently controlled.

It is another object of the present invention to provide a cluster tool and a maintenance method thereof in which the maintenance of a part of the equipment can be performed without stopping the whole equipment.

In order to solve the problems stated above, according to an aspect of the present invention, it is characterized in that it includes: a process ship having a process chamber and a load lock chamber coupled to each other; and an independent control section configured to control the process ship to operate while the process ship is not coupled to a loader module.

This structure makes it possible to control the process ship to independently operate, and consequently, it becomes unnecessary to operate a whole cluster tool in order to check the operation of the process ship, which enables efficient startup of the process ship.

According to another aspect of the present invention, it is characterized in that it includes: a loader module configured to house, align, and transfer an object to be processed; and an independent control section configured to control the loader module to operate while the loader module is not coupled to a process ship.

This structure makes it possible to control the loader module to independently operate, and consequently, it becomes unnecessary to operate a whole cluster tool in order to check the operation of the loader module, which enables efficient startup of the loader module.

According to still another aspect of the present invention, it is characterized in that it includes: a plurality of process chambers each configured to process an object to be processed; load lock chambers coupled to the process chambers respectively and each configured to transfer the object to be processed to each of the process chambers; a loader module coupled to the load lock chambers and configured to transfer the object to be processed to each of the load lock chambers; and an independent control section configured to independently control each unit that is an object of maintenance.

This structure makes it possible to stop the unit that is the object of the maintenance while units other than the object of the maintenance are kept operated, and accordingly, the maintenance can be performed while production is continued using the units other than the object of the maintenance, which enables improvement in production efficiency.

According to yet another aspect of the present invention, it is characterized in that transfer of each unit is independently controlled while a unit to be additionally installed of a cluster tool is not coupled.

This structure makes it possible to separately check the operation of a process ship and a loader module, and consequently, it becomes unnecessary to operate the whole system in order to additionally install the process ship, which enables efficient startup of the system.

According to yet another aspect of the present invention, it is characterized in that, in a maintenance method of a cluster tool in which a plurality of process ships are coupled to a loader module, maintenance is carried out while only a unit that is an object of the maintenance is stopped.

This structure makes it possible to continue production using a part of units in a cluster tool while the maintenance of the other units is carried out, which enables improvement in production efficiency.

BRIEF DESCRIPTION OF DRAWINGS

FIG. 5 is a block diagram showing the configuration of

FIG. 5 is a block diagram showing the configuration of independent control of a loader module according to the embodiment of the present invention.

FIG. 6 is a flowchart showing an independent maintenance method according to a first embodiment of the present invention.

FIG. 7 is a flowchart showing an independent maintenance method according to a second embodiment of the present invention.

BEST MODE FOR CARRYING OUT THE INVENTION

Hereinafter, a cluster tool according to an embodiment of the present invention will be explained with reference to the drawings.

Figure 1:
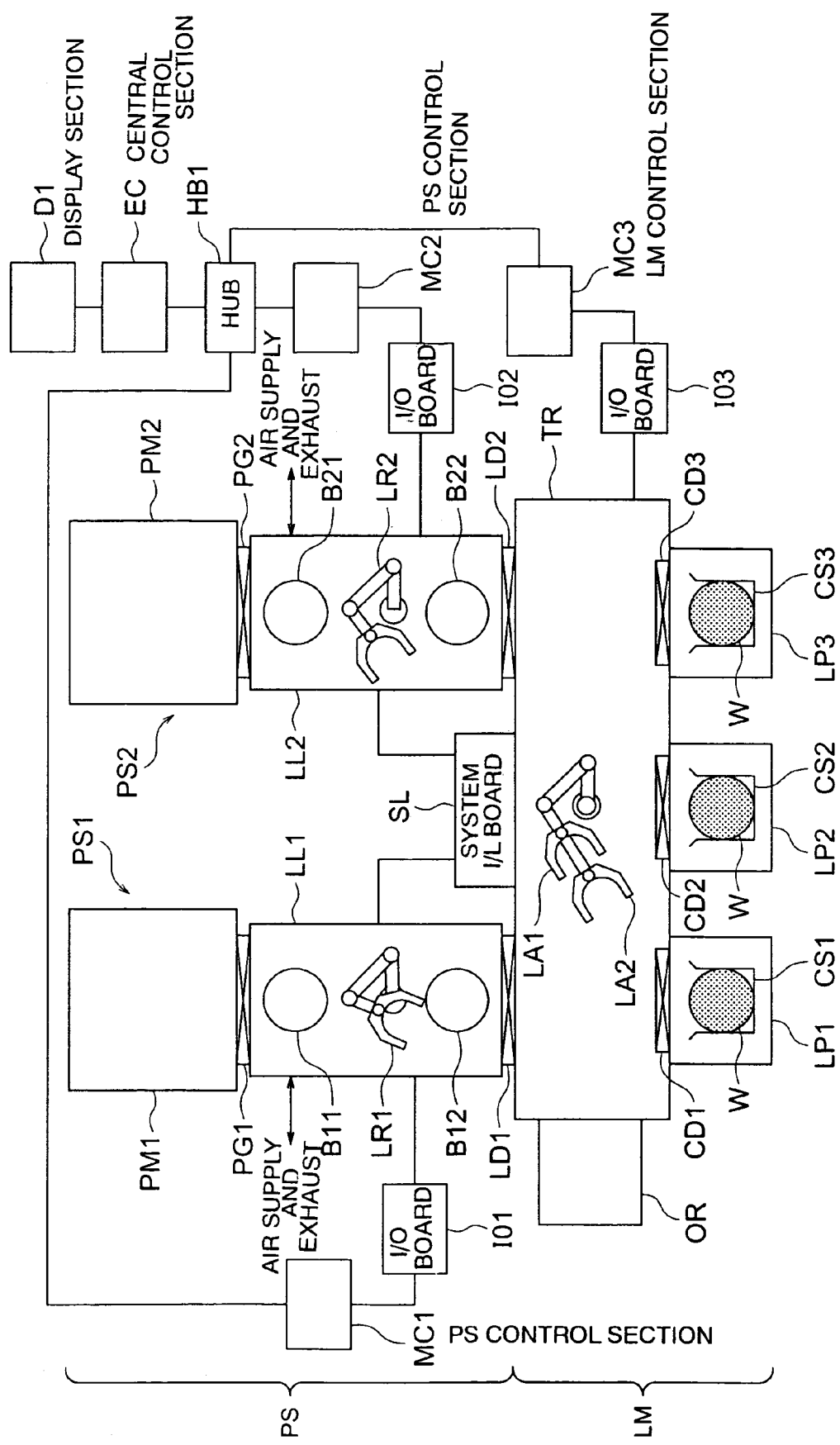
FIG. 1 is a block diagram showing the schematic configuration of a power supply system of a cluster tool according to an embodiment of the present invention.

FIG. 1 is a block diagram showing the schematic configuration of a cluster tool and a control system according to an embodiment of the present invention. In FIG. 1, a loader module LM includes load ports LP1 to LP3, a transfer chamber TR, and an orienter OR, and process ships PS1 and PS2 are coupled to this loader module LM via load lock doors LD1 and LD2. To the transfer chamber TR, the orienter OR is coupled and the load ports LP1 to LP3 are coupled via load port doors CD1 to CD3, and in the load ports LP1 to LP3, cassettes CS1 to CS3 housing unprocessed wafers W and processed wafers W are disposed.

The transfer chamber TR has therein loader arms LA1 and LA2 having a two-stage structure, and the loader arms LA1 and LA2 transfer the wafers W between the load ports LP1 to LP3 and the load lock chambers LL1 and LL2. Here, since the loader arms LA1 and LA2 have the two-stage structure, it is possible to carry a wafer W in by one of the loader arms LA1 and LA2 while a wafer W is carried out by the other one of the loader arms LA1 and LA2, which enables efficient replacement of the wafers W.

In the process ships PS1 and PS2, the load lock chambers LL1 and LL2 and process chambers PM1 and PM2 are provided, and the load lock chambers LL1 and LL2 and the process chambers PM1 and PM2 are coupled to each other via process gates PG1 and PG2. In the load lock chambers LL1 and LL2, wafer mounting tables B11, B12, and B21, B22, and load lock arms LR1 and LR2 are provided respectively, and on the wafer mounting tables B12 and B22, the wafers W carried in from the loader module LM are mounted and the wafers W to be carried out of the load lock chambers LL1 and LL2 are mounted. On the wafer mounting tables B11 and B21, the wafers W to be carried into the process chambers PM1 and PM2 are mounted. The load lock arms LR1 and LR2 transfer the wafers W between the load lock chambers LL1 and LL2 and the process chambers PM1 and PM2. Here, the air of the load lock chambers LL1 and LL2 are released to the atmosphere while the process chambers PM1 and PM2 are kept at a predetermined vacuum degree in order to prevent contamination. Therefore, in the load lock chambers LL1 and LL2, air supply and exhaust are carried out at the time of transfer to/from the transfer chamber TR or the transfer to/from the process chambers PM1 and PM2, so as to keep the vacuum degrees of both.

PS control sections (process ship machine controllers) MC1 and MC2 each intended for independently controlling the hardware of each of the process ships PS1 and PS2 are provided in the process ships PS1 and PS2 respectively, and a LM control section (loader module machine controller) MC3 intended for independently controlling the hardware of the loader module LM is provided in the loader module LM. These PS control sections MC1 and MC2 and the LM control section MC3 are connected to the process ships PS1 and PS2 and the loader module LM via I/O boards 101 to 103 configured to input/output data and addresses.

The PS control sections MC1 and MC2 and the LM control section MC3 are also connected to a central control section (equipment controller) EC via a hub HB1, and the central control section EC is connected to a display section D1. Here, the central control section EC controls the process ships PS1 and PS2 and the loader module LM so that the process ships PS1 and PS2 and the loader module LM operate in coordination with one another. A command is given to the central control section EC from the display section D1, so that the whole equipment can be controlled to operate in coordination.

A system interlock board SL to control interlock of the whole equipment is provided in the loader module LM, and it stops the operation of the whole equipment upon receiving an interlock signal.

Incidentally, each of the PS control sections MC1 and MC2 and the LM control section MC3 can be constituted by a controller composed of, for example, a CPU, a SRAM in which adjustment values and parameters are stored, a memory in which programs for operating the CPU are stored, and the like. When programs to control the process ships PS1 and PS2 and the loader module LM are installed in the memories provided in the PS control sections MC1 and MC2 and the LM control section MC3 respectively, the hardware of each of the process ships PS1 and PS2 and the loader module LM can be controlled to operate independently.

The central control section EC can be constituted by, for example, an equipment controller or a personal computer, and the installation of a program to control the whole equipment in the personal computer enables the control of the whole equipment.

Figure 2:
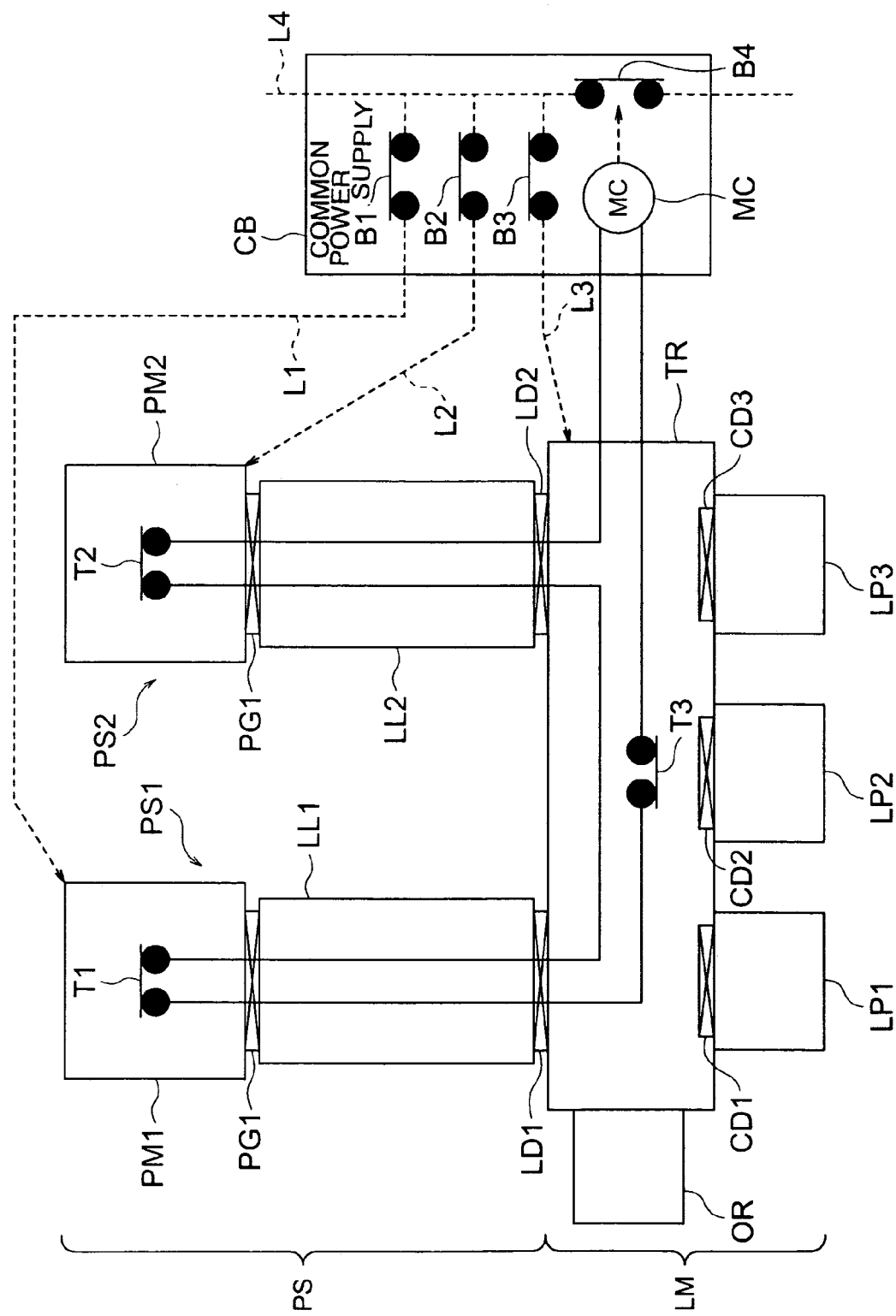
FIG. 2 is a block diagram showing a shift method of an operation mode of the cluster tool according to the embodiment of the present invention.
Figure 3:
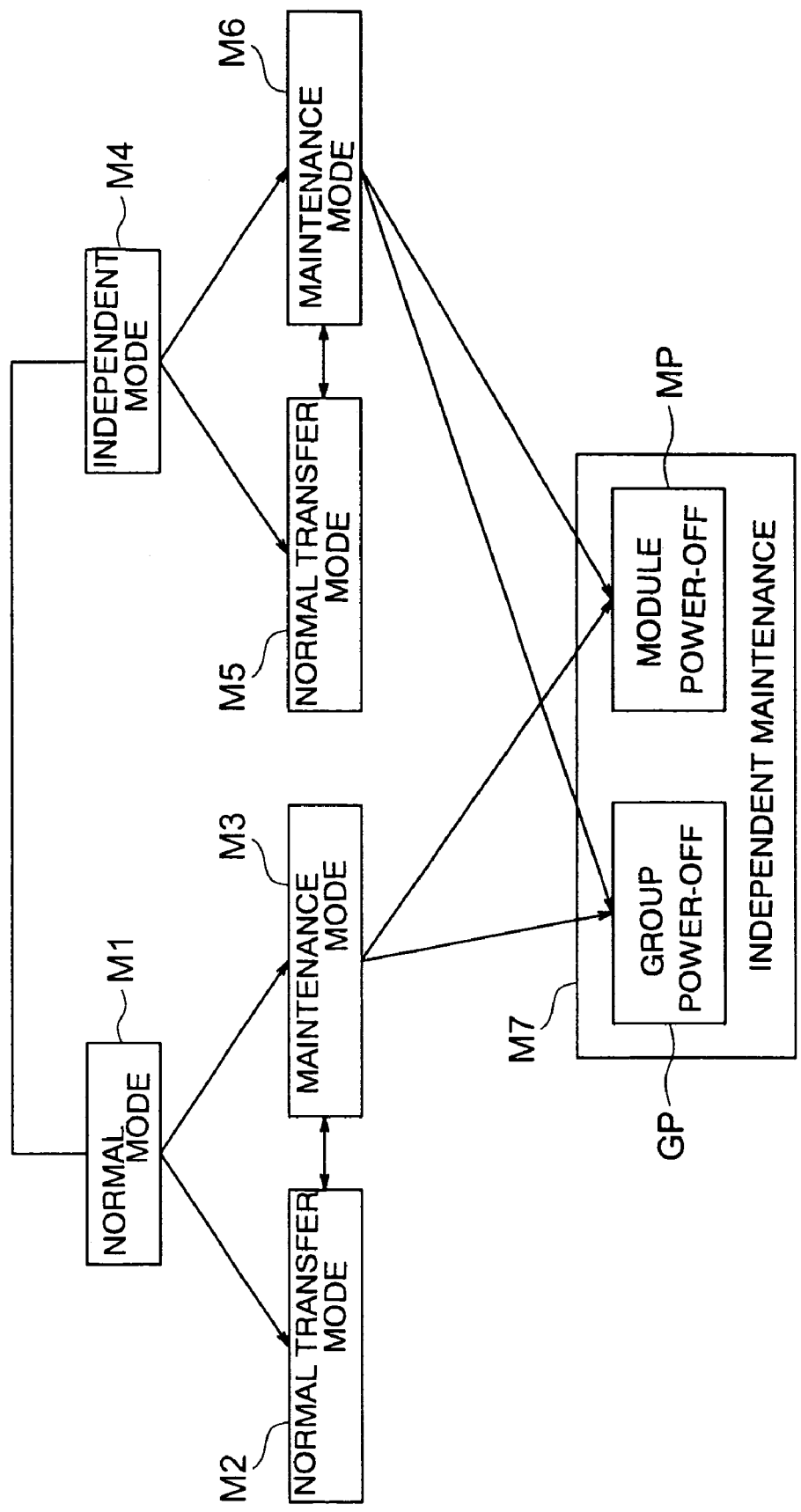
FIG. 3 is a block diagram showing the schematic configuration of the cluster tool and a control system according to the embodiment of the present invention.

FIG. 2 is a block diagram showing the schematic configuration of a power supply system of the cluster tool according to the embodiment of the present invention. In FIG. 2, provided is a common power supply CB to supply the process ships PS1 and PS2 and the loader module LM with electric powers from a power line L4. Here, breakers B1 to B3 for electric power interruption are separately provided in power lines L1 to L3 through which the electric powers are supplied to the process ships PS1 and PS2 and the loader module LM, so that each of the process ships PS1 and PS2 and the loader module LM can be independently supplied with the electric power. The process ships PS1 and PS2 and the loader module LM also have hardwire interlock mechanisms, which can interlock hardwire by opening terminals T1 to T3 when the process ships PS1 and PS2 and the loader module LM are not coupled to one another. To be more specific, the breaker B4 is provided in the power line L4, and when a magnet conductor MC receives a hardwire interlock signal, the breaker B4 is turned off to interrupt the electric power supply to the process ships PS1 and PS2 and the loader module LM. Therefore, when the process ships PS1 and PS2 are removed or coupled while the equipment is in operation, the electric power to the whole equipment can be interrupted. FIG. 3 is a block diagram showing a shift method of an operation mode of the cluster tool according to the embodiment of the present invention. In FIG. 3, provided are a normal mode M1 in which the whole equipment is operated while the process ships PS1 and PS2 and the loader module LM are coupled to one another and an independent mode M4 in which each of the process ships PS1 and PS2 and the loader module LM is independently operated while the process ships PS1 and PS2 and the loader module LM are not coupled to one another, and the normal mode M1 and the independent mode M4 include normal transfer modes M2 and M5 and maintenance modes M3 and M6 respectively.

Therefore, normal transfer and maintenance can be performed by the same operation both in the normal mode M1 and the independent mode M4, which enables operation without being conscious of independent control even when the process ships PS1 and PS2 and the loader module LM are independently controlled.

The maintenance modes M3 and M6 have an independent maintenance mode M7 in which independent maintenance of only a part of the equipment is possible without stopping the whole equipment, and this independent maintenance mode M7 has a group power-off mode GP and a module power-off mode MP. Here, in the group power-off mode GP, it is possible to produce the state in which all the power supplies involved in a designated group (the process ship PS1 or PS2, or the loader module LM) can be turned off. This makes it possible to stop only one of the process ships PS1 and PS2 while the whole equipment is in operation and to perform the maintenance of this process ship PS1 or PS2 while the other one of the process ships PS1 and PS2 and the loader module LM are kept operated.

In the module power-off mode MP, it is possible to produce the state in which only power supply involved in a designated module can be turned off. Consequently, it is possible to exchange parts of the I/O board 101 to 103 while a communication line connected to, for example, one of the I/O boards 101 to 103 is physically/electrically disconnected, and to establish reconnection by moving the communication line after the installation.

Figure 4:
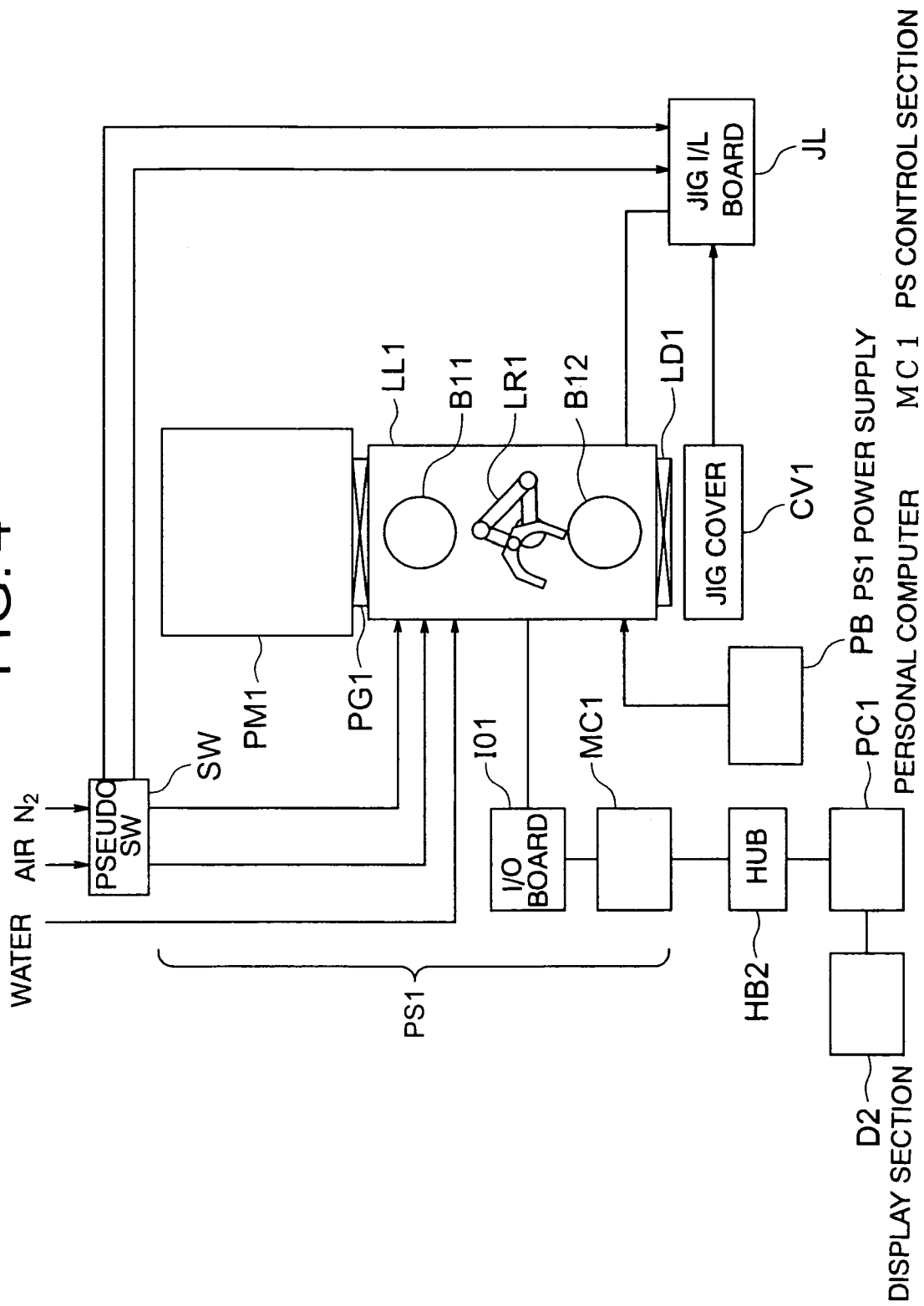
FIG. 4 is a block diagram showing the configuration of independent control of a process ship according to the embodiment of the present invention.

FIG. 4 is a block diagram showing the configuration of independent control of the process ship according to the embodiment of the present invention. In FIG. 4, in order to operate, for example, the process ship PS1 independently, the process ship PS1 is physically removed from the cluster tool in FIG. 1 while all the powers of the cluster tool in FIG. 1 are turned off. Then, a personal computer PC1 or an equipment controller that provides a GUI (graphical user interface) function and gives a command of a transfer procedure and so on is connected to the PS control section MC1 via a hub HB2. Further, a PS1 power supply to supply electric power to the process ship PS1 is connected and a jig I/L board JL to emulate interlock that needs to be cancelled in order to put the process ship PS1 into independent operation is attached. Further, a jig cover CV1 for danger protection is attached, and "air" and "N2" are supplied via a pseudo pressure switch SW for "air" and "N2". Then, an urgent stop signal and a hardwire interlock signal outputted from the process ship PS1 are supplied to the jig I/L board JL, a door open/close prohibiting signal outputted from the jig cover CV1 is supplied, and a gas valve close signal and a solenoid valve power-off signal outputted from the pressure switch SW are supplied.

Here, the PS control section MC1 has all the functions for controlling the process ship PS1 to operate in terms of hardware, such as functions for operating the load lock arm LR1 and for opening/closing valves. Therefore, when the personal computer PC1 gives the command of the transfer procedure to the PS control section MC1, it is made possible to control the process ship PS1 to independently operate in the state as if the process ship PS1 were coupled to the loader module LM, and consequently, an operator can operate the process ship PS1 without being conscious of independent control.

Therefore, by giving a command to the personal computer PC1 from the display section D2, the operator can check and adjust the independent operation of the process ship PS1 (teaching of the load lock arm LR1 and so on), and can make process evaluation, which enables reduction in the lead time (the time from the order to the delivery of the equipment).

Figure 5:
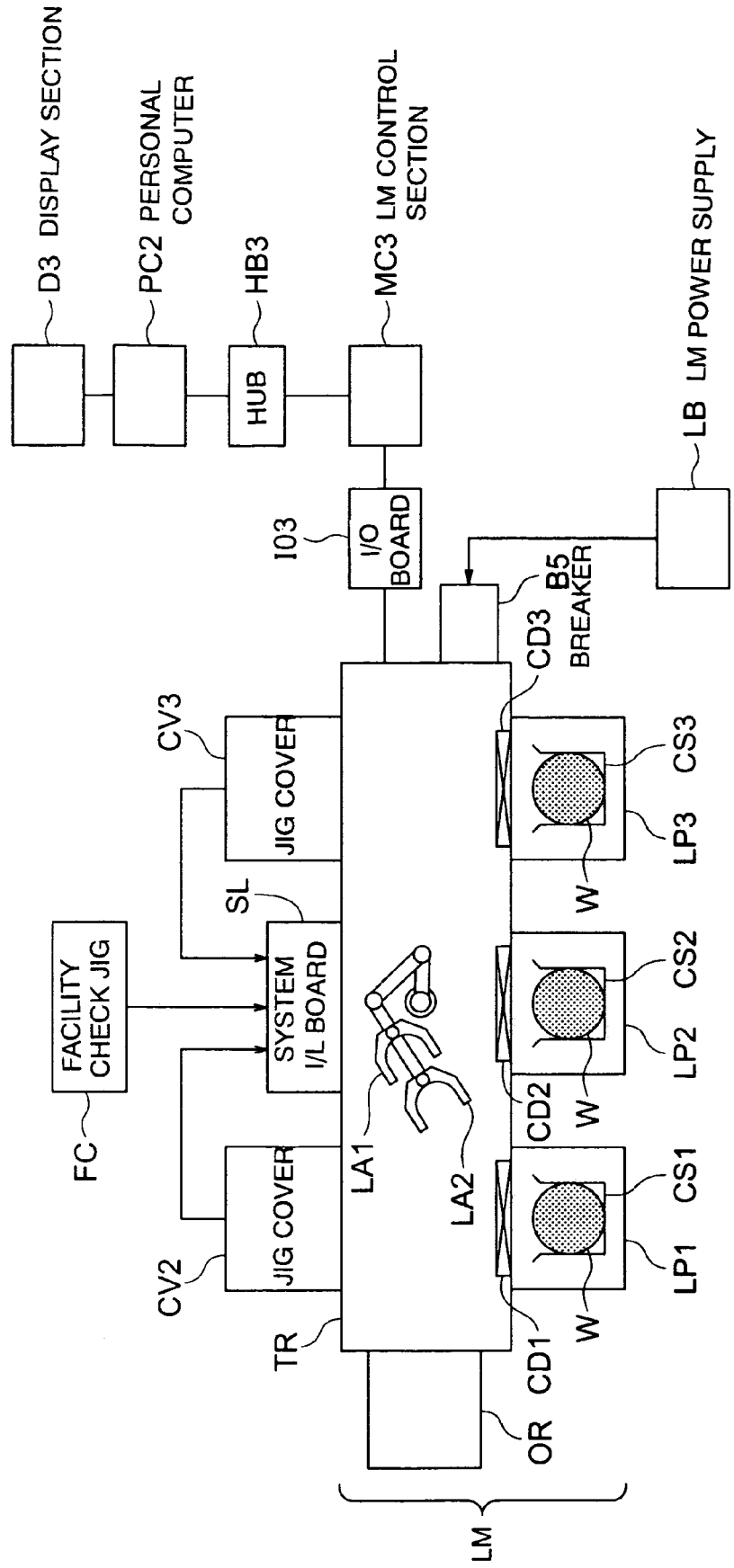

FIG. 5 is a block diagram showing the configuration of independent control of the loader module according to the embodiment of the present invention. In FIG. 5, in order to operate the loader module LM independently, the loader module LM is physically removed from the cluster tool in FIG. 1 while all the powers of the cluster tool in FIG. 1 are turned off. Then, a personal computer PC2 or an equipment controller that provides a GUI (graphical user interface) function and gives a command of the transfer procedure and so on is connected to the LM control section MC3 via a hub HB3. Further, an LM power supply LB to supply electric power to the loader module LM is connected via a breaker B5, jig covers CV2 and CV3 having a function of allowing the loader arms LA1 and LA2 to tentatively put wafers thereon are attached, and a facility check jig FC capable of checking all the interlock factors sent from the process ships PS1 and PS2 is attached. Then, an interlock signal outputted from the facility check jig FC is supplied to the system interlock board SL while load lock chamber door non-open signals outputted from the jig covers CV2 and CV3 and a signal for canceling interlock that prohibits the extension of the loader arms LA1 and LA2 to the load lock chambers LL1 and LL2 are supplied.

Here, the LM control section MC3 has all the functions for controlling the loader module LM to operate in terms of hardware, such as functions for operating the loader arms LA1 and LA2 and for opening/closing valves. Therefore, when the personal computer PC2 gives the command of the transfer procedure to the LM control section MC3, it is possible to control the loader module LM to independently operate in the state as if the process ship PS1 were coupled to the loader module LM, and consequently, the operator can operate the loader module LM without being conscious of independent control.

FIG. 6 is a flowchart showing an independent maintenance method according to a first embodiment of the present invention. Note that, in this first embodiment, independent maintenance is performed in the group power-off mode GP in FIG. 3. In this group power-off mode GP, it is possible to produce the state in which all the power supplies involved in a designated group can be turned off. Further, all the powers for usage (water, air, and so on) supplied to this group can be also interrupted and an electric power to the CPU of this group can be also interrupted.

In FIG. 6, an operator shifts on a screen of the display section D1 in FIG. 1 to a maintenance window of the group for which the maintenance is to be performed (S1), and gives a group power-off mode GP execution demand (S2). Here, an example of a possible group to be designated as the group for which the maintenance is to be performed is the process ship PS1 or PS2, or the loader module LM.

When the group power-off mode GP execution demand is given, i) the I/O board 101 to 103 of the corresponding group is initialized, and ii) an Ethernet line between the PS control section MC1 or MC2, or the LM control section MC3 that is the corresponding group and the central control section EC is disconnected (S3). This enables the suspension of accesses to all the hardware including the CPU only of the process ship PS1 when, for example, the process ship PS1 is selected as the corresponding group, and consequently, the interruption of all the powers for usage involved in the process ship PS1 and the interruption of an electric power to the CPU are made possible while the process ship PS2 and the loader module LM are kept operated.

When the shift to the group power-off mode GP is completed, a shift completion message is displayed on the display section D1 (S4). Then, the operator, upon confirming the shift to the group power-off mode GP, turns off the breaker B1 to B3 of the corresponding group to turn off the power supply of the PS control section MC1 or MC2, or the LM control section MC3 (S5), so that the operator can perform maintenance work for the corresponding group (S6). Through this maintenance work, part exchange, remodeling, and so on in the process ship PS1 or PS2 having abnormality are made possible while the production is continued using the process ship PS1 or PS2 in a normal state, which can reduce the down time of the whole equipment.

When the maintenance work is finished, the operator normally connects the hardware such as the I/O board 101 to 103 and the power supply of the corresponding group (S7) and turns on the power supply of the PS control section MC1 or Mc2, or the LM control section MC3 of the corresponding group (S8).

When the power supply of the corresponding group is turned on, i) the link is established, ii) a program for controlling the PS control section MC1 or MC2 or the LM control section MC3 is downloaded to the corresponding group, iii) data stored in the PS control section MC1 or MC2 or the LM control section MC3 that is the corresponding group is made consistent with data in the central control section EC, iv) I/O self diagnosis is performed, v) use/nonuse setting for each I/O is made from the PS control section MC1 or MC2, or the LM control section MC3 that is the corresponding group, vi) the I/Os are initialized, and vii) the corresponding group is started in the maintenance state, resulting in the restoration of the corresponding group (S9). Then, when the restoration of the corresponding group is completed, the restoration completion message is displayed on the display section D1 (S10).

FIG. 7 is a flowchart showing an independent maintenance method according to a second embodiment of the present invention. Note that, in this second embodiment, independent maintenance is performed in the module power-off mode MP in FIG. 3. In this module power-off mode MP, it is possible to produce the state in which only the power supply involved in a designated module can be turned off, and the CPU of the PS control section MC1 or MC2, or the LM control section MC3 is not the object of electric power interruption. This eliminates the necessity of restarting software such as downloading a program after the maintenance work, which can further reduce the restoration time of the equipment after the maintenance work.

In FIG. 7, an operator shifts on the screen of the display section D1 in FIG. 1 to a maintenance window of a module for which maintenance is to be performed (S21) and gives a module power-off mode MP execution demand (S22). Here, for example, any one of the I/O boards 101 to 103 or the like can be designated as the module for which the maintenance is to be performed.

When the module power-off mode MP execution demand is given, i) the I/O board 101 to 103 of a corresponding group is initialized, ii) access to all input/output data DIO and input/output addresses AIO are suspended, iii) communication between the PS control section MC1 or MC2, or the LM control section MC3 that is the corresponding group and external equipment is suspended, and iv) a communication line between the PS control section MC1 or MC2, or the LM control section MC3 that is the corresponding group and the I/O board 101 to 103 is disconnected (S23). Consequently, accesses to the hardware except the CPU of the PS control section MC1 or MC2, or the LM control section MC3 can be suspended, which enables the exchange and so on of the I/O board 101 to 103 only by minimum partial power interruption required.

When the shift to the module power-off mode MP is completed, the shift completion message is displayed on the display section D1 (S24). Then, the operator, upon confirming the shift to the module power-off mode MP, can interrupt the electric power to the I/O board 101 to 103 that is the object of the maintenance (S25) and can perform the maintenance work of the corresponding module (S26). Through this maintenance work, the exchange and so on of the I/O board 101 to 103 is made possible while the CPU of the PS control section MC1 or MC2, or the LM control section MC3 is kept operated, which can reduce the restoration time of the equipment after the maintenance work.

When the maintenance work is finished, the operator normally connects the hardware such as the I/O board 101 to 103 and the power supply of the corresponding group (S27) and gives a restoration demand of the corresponding module on the screen of the display section D1 (S28).

When the restoration demand of the corresponding module is given, i) an Ethernet line between the central control section EC and the I/O board 101 to 103 is connected, ii) communication between the PS control section MC1 or MC2, or the LM control section MC3 that is the corresponding group and the external equipment is started, iii) I/O self-diagnosis is performed, iv) the I/O board 101 to 103 is initialized, v) accesses to all input/output data DIO and input/output addresses AIO are started, and vi) the corresponding group is started in the maintenance state, resulting in the restoration of the corresponding group (S29). Then, when the restoration of the corresponding module is completed, a restoration completion message is displayed on the display section D1 (S30).

Incidentally, the explanation in the above-described embodiment is given on the case when two process ships PS1, PS2, three load ports LP1 to LP3, and only one orienter are provided, but the number of the process ships PS1, PS2 may be any as long as it is two or more, the number of the load ports LP1 to LP3 may be any as long as it is one or more, and two orienters may be provided, one for each of both sides of the transfer chamber TR. Further, the explanation is given on the case when two wafer mounting tables B11 and B12, or B21 and B22 are provided in each of the load lock chambers LL1 and LL2, but one wafer mounting table may be provided in each of the load lock chambers LL1 and LL2. The case when the loader arms LA1 and LA2 have the two-stage structure is explained, but a one-stage structure may also be adopted. As is explained hitherto, according to the present invention, the operation of the process ship and the loader module can be checked while the process ship is not coupled to the loader module.

Further, according to the present invention, it is possible to perform maintenance of an arbitrary process ship while the whole equipment is not stopped.

INDUSTRIAL APPLICABILITY

A semiconductor production system, a cluster tool, a control method of the semiconductor production system, and a maintenance method of the cluster tool according to the present invention are usable in the semiconductor manufacturing industry and so on that manufacture semiconductor devices. Therefore, they have industrial applicability.

What is claimed is:

1. A process ship used in a semiconductor production system, the semiconductor production system having a plurality of the process ships controlled independently of each other, comprising:
   a process chamber which processes an object to be processed;
   a load lock chamber coupled to said process chamber, said load lock chamber transferring the object to be processed to/from said process chamber;
   a process ship controller provided for said process ship, said process ship controller controlling said process ship;
   a signal emulator which generates a signal necessary for independently operating said process ship as a maintenance operation and sends the signal to said process ship controller so as to control said process ship while said process ship is detached from the semiconductor production system and controlled independently for said maintenance operation; and
   a jig cover which covers a connection point of the semiconductor production system during said process ship being detached from the semiconductor production system.

2. A process ship according to claim 1, wherein the plurality of the process ships of the semiconductor production system includes at least two process ships in which each of the at least two process ships has a process chamber and a respective load lock chamber coupled to the process chamber.

* * * * *